United States Patent [19]

Kobayashi

[11] Patent Number: 4,984,050
[45] Date of Patent: Jan. 8, 1991

[54] GATE-ARRAY TYPE INTERGATED CIRCUIT SEMICONDUCTOR DEVICE

[75] Inventor: Masaharu Kobayashi, Tokyo, Japan

[73] Assignee: NEC Corporation, Tokyo, Japan

[21] Appl. No.: 297,628

[22] Filed: Jan. 13, 1989

[30] Foreign Application Priority Data

Jan. 14, 1988 [JP] Japan .................................. 63-7160

[51] Int. Cl.⁵ .......................................... H01L 27/02
[52] U.S. Cl. ......................................... 357/41; 357/40;
357/45; 357/43; 357/54; 357/68; 357/65; 357/71
[58] Field of Search .................... 357/41, 40, 45, 43, 357/54, 68, 65, 71

[56] References Cited

U.S. PATENT DOCUMENTS

| | | | |
|---|---|---|---|
| 3,667,006 | 5/1972 | Ruegg | 357/35 X |
| 3,708,691 | 1/1973 | Gilbert | 357/35 X |
| 4,233,618 | 11/1980 | Genesi | 357/35 O R |
| 4,417,265 | 11/1983 | Murkland et al. | 357/35 X |
| 4,737,836 | 4/1988 | Askin et al. | 357/40 X |

Primary Examiner—William Mintel
Attorney, Agent, or Firm—Helfgott & Karas

[57] ABSTRACT

A gate array type integrated circuit semiconductor device includes a semiconductor substrate, in a basic cell forming portion of which are formed a plurality of impurity regions of basic circuit elements. The impurity regions form a plurality of basic cells. A field insulating layer is also formed on the substrate, which is partially embedded in the major surface of the substrate and is formed entirely on a wiring channel forming portion of the substrate and selectively on the basic cell forming portion of the same to surround each of the impurity regions. An insulating film is formed on the field insulating layer. A wiring structure is provided, which includes mutual wirings formed of a first level conductive layer, internal wirings, and interconnecting wirings formed of a second level conductive layer higher than the first level conductive layer. Each of the mutual wirings is formed only on the insulating film formed on the wiring channel forming portion and is connected to the impurity regions through the interconnecting and internal wirings.

8 Claims, 7 Drawing Sheets

GATE-ARRAY TYPE INTERGATED CIRCUIT SEMICONDUCTOR DEVICE

FIELD OF THE INVENTION

The present invention relates to a gate-array type integrated circuit semiconductor device, and more particularly, to a wiring structure thereof.

DESCRIPTION OF THE RELATED ART

The gate-array type integrated circuit semiconductor device is one kind of master slice type device, and it is constructed, after receiving customer's order, by forming personalized wirings or application wirings on a master substrate in which various basic circuit elements have been provided in advance. The wiring pattern is designed by a computer processing in accordance with the customer's order or requirement to obtain the required functions for a specific application by connecting selected basic circuit elements. The device can be manufactured in a shorter time than a full-custom device which is manufactured by forming necessary circuit elements as well as wirings after receiving customer's requirement, and therefore, the demand for the gate-array type semiconductor device has been increased in recent years.

Generally, in a gate-array type semiconductor device, basic cells or basic units each comprising a plurality of transistors, resistors, capacitors, etc. constituting a unit logic gate are disposed in the shape of a matrix on a silicon substrate, while wiring channel regions, on which mutual wirings are formed for connecting the logic gate provided in each basic cell with the logic gate of the other basic cell, are provided between the basic cell lines. Further, input/output buffer circuits are disposed on the outer periphery of a region containing all of the basic cells and the wiring channel regions, so that they serve as an interface of a signal level in an integrated circuit with an external input/output signal level.

According to the past manufacturing technique for integrated circuits, the performance of a semiconductor element formed, that of a transistor, in particular, is relatively low, and a time for logical operation (hereinafter mentioned as a gate delay) of the logic gate is large. Moreover, the number of cells mounted is small since the integrity is of a relatively small scale, and a mutual wiring connecting logic gates and extending on the wiring channel region is relatively short. Accordingly, a delay time of a signal is mostly due to the gate delay of the logic gate, while the effect of a wiring delay due to the capacitance of the mutual wiring is relatively small.

With a remarkable progress in the recent manufacturing technique for integrated circuits, however, the performance of the semiconductor element formed, that of the transistor, in particular, has been very much improved, and consequently the gate delay of the logic gate has been reduced to be several times smaller than in the past. Meanwhile, with a remarkable improvement in the integrity, the number of gates mounted on a gate line or array, which amounted to several hundreds to several thousands in the past, has so increased that gate arrays whereon several tens of thousands of gates are mounted have been put in practical use recently. Therefore, a mean wiring length of mutual wirings connecting logic gates in respective basic cells is increased considerably as the number of the gates mounted becomes large. Although the capacitance of wirings for a unit length is reduced, of course, by a progress in a processing technique, including a scaling process for a wiring width, the rate of increase in the mean wiring length of wirings exceeds the effect of reduction in the wiring capacitance for the unit length, and consequently a mean capacitance of wirings connecting logic gates is increased, which causes an increase in the effect of a wiring delay due to the capacitance of wirings. In the case of an inverter gate in an ECL logic circuit construction, for instance, the gate delay in a basic cell is 300 ps and the mutual wiring delay is 50 ps/mm according to the conventional manufacturing technique, while the gate delay of 100 ps in a basic cell and the wiring delay of 30 ps/mm are now attained by using an up-to-date manufacturing technique, on the assumption that power consumptions of inverter gates on both occasions are equal to each other. Namely, under the standard loading conditions for a wiring length of 3 mm, the delay time of the inverter gate made by using the previous manufacturing technique is 450 ($=300+50\times3$) ps, while the delay time of the inverter gate made by using the up-to-date technique is 190 ($=100+30\times3$) ps, and the rate of the wiring delay in a delay time is 33% in the previous manufacturing technique, while it amounts to 47% in the up-to-date manufacturing technique. Thus, the reduction of the capacitance of mutual wirings in the wiring channel region has become one problem for attaining a high speed in operations of integrated circuits.

As for main methods for reducing the capacitance of wirings, two methods can be mentioned herein: a method wherein wiring widths are lessened, and a method wherein spaces between the wirings and the silicon substrate are enlarged.

As for the first method wherein the wiring widths of signal wirings are lessened, it is difficult to reduce the capacitance of the wirings by this method, because the capacitance of the wirings is not reduced so much even when the wiring widths are lessened, owing to a fringe effect which becomes considerable when the wiring width is 3 $\mu$m or less, and because the occurrence of electromigration increases sharply when the wiring width is lessened.

The second method wherein the spaces between the wirings and the substrate are enlarged can be realized by increasing the film thickness of the silicon oxide layer thermally grown and partially embedded in the substrate for element isolation or that of the inter-ply insulating film between the oxide layer and the wirings. In a conventional manufacturing method, however, it is necessary to prolong a time for oxidation further for increasing the film thickness of the silicon oxide layer, and when the time for oxidation is prolonged, the silicon oxide layer grows also in the lateral direction, which causes a problem that an element region is narrowed. This has a large effect on the nonuniformity in the characteristics of an element, and turns out to be a factor to cause the lowering of a yield. Moreover, there is another problem that the silicon oxide layer does not grow so much even by prolongation of the time for oxidation, since the supply of oxygen lessens when the film thickness of the silicon oxide layer increases to some extent. On the other hands, it is easy to relatively increase the film thickness of the inter-ply insulating film. When the film thickness of the inter-ply insulating film is increased, however, internal wirings tend to be disconnected in the parts of electrodes of an element in the basic cell, causing the problem that the reliability of integrated circuits lowers. This makes it necessary, otherwise, to develop such a new manufacturing technique as to give an inclination to an opening for contact so as to prevent disconnection.

SUMMARY OF THE INVENTION

Accordingly, it is an object of the present invention to provide a gate-array type integrated circuit semiconductor device in which the capacitance of the mutual wiring on the wiring channel region can be reduced without causing adverse effects to circuit elements and internal wirings on the basic cell region.

Accordingly to a feature of the present invention, there is provided a gate-array type integrated circuit semiconductor device comprising a semiconductor substrate, and a plurality of basic cell lines formed on the semiconductor substrate. The basic cell lines are arranged in parallel with each other and extending in a first direction. Each of the basic cell lines includes a plurality of basic cells in which basic circuit elements are formed. A plurality of wiring channel regions disposed on the substrate between the basic cell lines, respectively, which extend in the first direction. A field insulating layer is formed on the substrate and is partially embedded in a major surface of the substrate. The field insulating layer is formed entirely at the wiring channel regions and formed selectively at the basic cells. The thicker insulating films are formed on the field insulating layer at the wiring channel regions, respectively, each of the thick insulating films extending in the first direction at the wiring channel regions with a predetermined width. A plurality of mutual wirings of a first level conductive layer are formed on the thick insulating films on the respective wiring channel regions and extend in the first direction. Interval wirings of the first level conductive layer are formed on the basic cells, which connect the circuit elements therein. Interconnecting wirings of a second level conductive layer higher than the first level conductive layer connect the internal wirings on the basic cell and corresponding mutual wirings on the wiring channel region, respectively, and extend in a second direction perpendicular to the first direction. The device may further comprise a thin insulating film covering the thick insulating films, the field insulating layer and the circuit elements such that the mutual wirings are attached to the thin insulating film above the thick insulating film at the wiring channel regions. The internal wirings may be attached to the thin insulating film at the basic cells. The first and second level conductive layers may be made of aluminum or aluminum alloy, and the thick and thin insulating films may be made of silicon oxide. Further the device may comprise peripheral circuits such as input/output buffer circuits formed on the periphery of the substrate and connected to corresponding mutual wirings extending on the wiring channel regions. The thickness of the thick insulating film is favorably 0.7 $\mu$m or more to reduce effectively the capacitance of the mutual wiring, and 1.5 $\mu$m or less to avoid breakage of the interconnecting wiring on the edge of the thick insulating film at the wiring channel region. On the other hand, the thickness of the thin insulating film is favorably 0.2 $\mu$m or more to ensure the insulation between the internal wiring and the circuit element region in the substrate and favorably 0.5 $\mu$m or less to avoid breakage of the internal wiring in the basic cell.

DESCRIPTION OF THE PRIOR ART

Figure 1A:
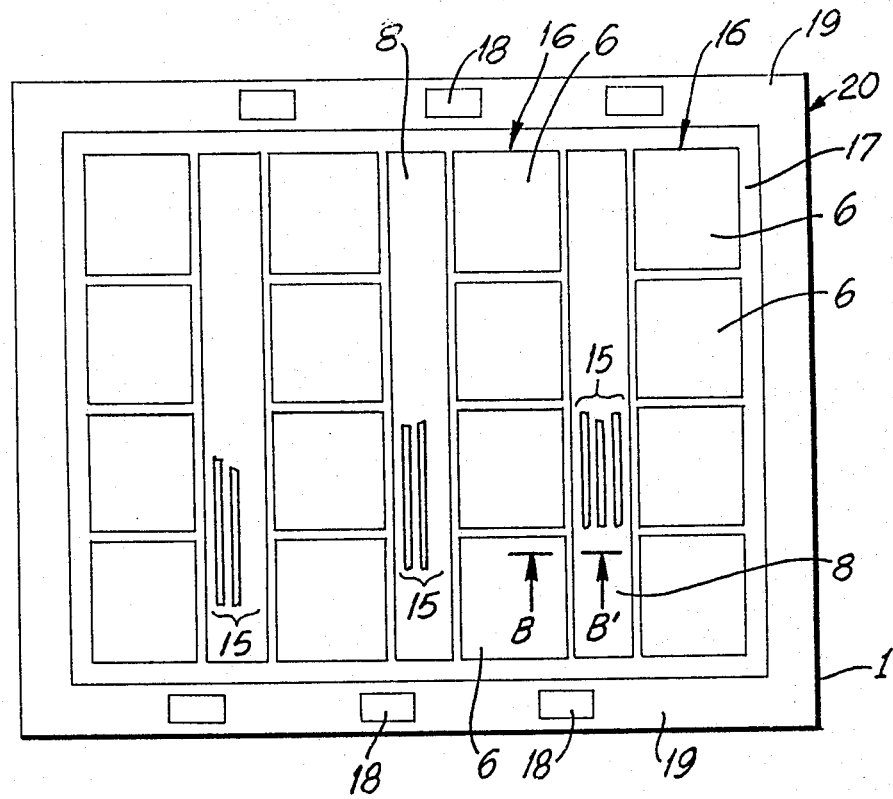
FIG. 1A is a plan view showing a gate-array type integrated circuit semiconductor device in a prior art.

Referring to FIG. 1A, a gate-array type integrated circuit semiconductor device 20 in a prior art comprises a silicon substrate 1. A plurality of basic cell lines 16 arranged in parallel with each other and extending in a first direction (vertical direction in FIG. 1A) and a plurality of wiring channel regions 8 arranged between the basic cell lines 16 and extending in the first direction are disposed on a center section 17 of the substrate, and a plurality of peripheral circuits 18 such as input/output buffer circuits of the device are disposed on a peripheral section 19 of the substrate outside the center section 17. Each of the basic cell lines 16 includes a plurality of basic cells 6 arranged in the first direction.

Figure 1B:
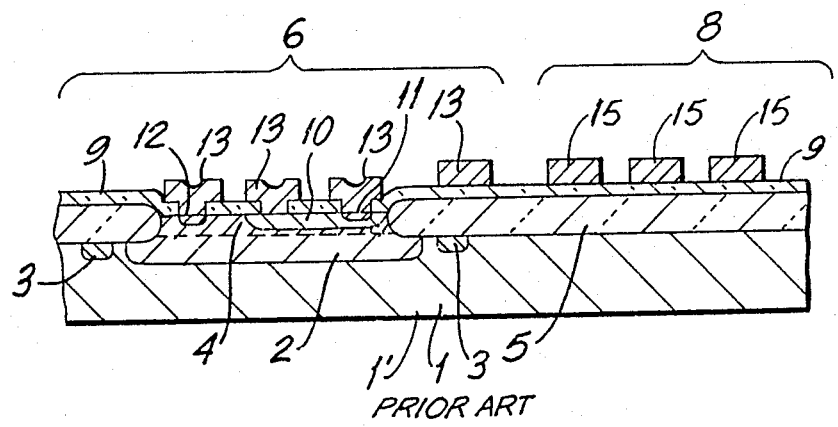
FIG. 1B is an enlarged cross-sectional view taken along line B—B' in FIG. 1A as viewed in the direction of arrows.

Referring to FIG. 1B, the silicon substrate 1 includes a P-type silicon body 1' and an N⁻-type epitaxial silicon layer 4 formed on the silicon body and serving as a collector region of a transistor, and an N⁺-type collector buried layer 2 is formed between the epitaxial layer 4 and the silicon body 1'. A thick field silicon oxide layer 5 is formed in the substrate 1 from a major surface of the substrate (surface of the epitaxial layer) inwardly such that it is partially embedded in the substrate by thermal oxidation of the substrate. The thick field silicon oxide layer 5 having 1.5 $\mu$m thickness is entirely formed at the wiring channel region 8 having a rectangular plan shape (FIG. 1A), and selectively formed at the basic cell region 6 such that basic circuit element forming parts such as transistor forming part(s) in the basic cell are exposed. A P-type base region 10 and an N⁺-type emitter region 11 of the bipolar transistor as the basic circuit element are formed, and a P⁺-type channel stopper region 3 surrounding the transistor forming region is formed under the thick field silicon oxide layer 5. An inter-ply silicon oxide film 9 having 0.5 μm thickness is formed on the whole surface, and contact holes are provided in the film 9 to expose parts of the emitter region 11, the base region 12 and an N+-type collector contact region 12. Then, an aluminum layer or the like is deposited entirely as a first level conductive layer, and selective etching is applied to form the wiring pattern of the first level conductive layer including internal wirings 13 in the basic cells for connecting parts of the transistor as a basic circuit element and other parts of other basic circuit elements within each basic cell to form a logic gate in each basic cell, and mutual wirings 15 on the wiring channel regions 8. The mutual wiring 15 extends in the first direction (FIG. 1A), and used for connecting one logic gate in one basic cell and another logic gate in another basic cell through interconnecting wirings (not shown in FIG. 1A and 1B) made of a second level aluminum layer and extending in a second direction perpendicular to the first direction.

DETAILED DESCRIPTION OF THE EMBODIMENTS

Figure 2A:
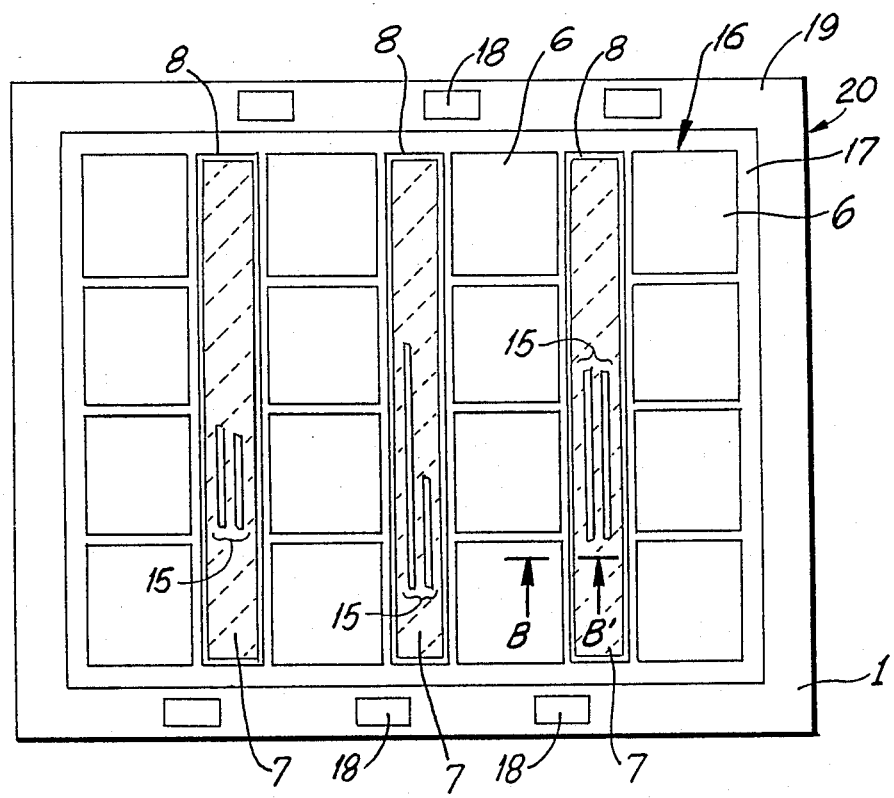
FIG. 2A is a plan view showing an embodiment of the present invention.
Figure 2B:
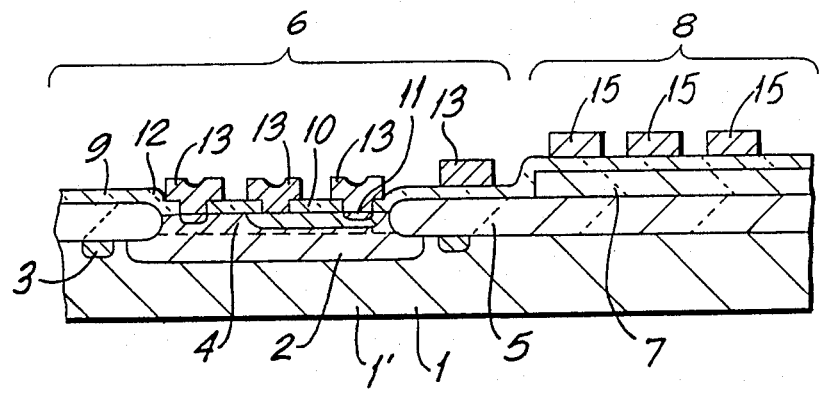
FIG. 2B is an enlarged cross-sectional view taken along line B—B' in FIG. 2A as viewed in the direction of arrows.

In FIGS. 2A and 2B, the same components as those in FIGS. 1A and 1B are indicated by the same reference numerals. According to the present embodiment, after forming the thick field silicon oxide layer 5 of 1.5 μm thickness, a thick silicon oxide film 7 of 1.0 μm thickness is formed on the thick field oxide layer 5 at every wiring channel region 8 by well-known CVD and PR processes. The thick silicon oxide films are formed only on the wiring channel regions 8 and never be formed on the basic cell regions 6 and on the peripheral circuit regions 18. That is, each of the thick insulating films 7 has a rectangular plan shape extending in the first direction and occupies the substantially whole area of the wiring channel region 8 as indicated in right-upward dot hatching in FIG. 2A. After forming the thin silicon oxide film 9 of 0.5 μm thickness entirely and forming necessary contact holes in the film 9, an aluminum layer or like is deposited entirely, and the aluminum layer is selectively etched by well-known PR process to form internal wirings 13 to constitute basic logic gates in the basic cells 6, and to form mutual wirings 15 extending in the first direction in a long distance at the wiring channel regions 8 on the thick insulating films 7 of the present invention. The internal wirings and corresponding mutual wirings 15 are connected by interconnecting wirings (not shown in FIGS. 2A and 2B) of a second level conductive layer extending in a second direction perpendicular to the first direction formed on the first level conductive layer by interposing another inter-ply silicon oxide layer (not shown), to constitute a logic circuit of the device by connecting one basic logic circuit constituted by basic circuit elements and internal wirings in one basic cell and another basic logic circuit constituted by basic circuit elements and internal wirings in another basic cell. In the embodiment, only a transistor is used as a basic circuit element in the basic cell. However, if necessary, a resistor, an FET, a diode, a capacitor, etc. are also used and formed beforehand, as the basic circuit element to constitute a basic logic gate in the basic cell.

In this embodiment, the wiring capacitance per unit length of the mutual wiring 15 in the wiring channel region 8 is made smaller by 33% than the wiring capacitance in FIG. 1 in which the thick insulating film 7 of the present invention is not provided. Namely, when a wiring delay of the mutual wiring in FIG. 1 is 30 ps/mm in transmission of signals, the wiring delay of the mutual wiring in FIG. 2 becomes 20 ps/mm. Therefore, under the standard loading conditions for a wiring length of 3 mm and under the gate delay of 100 ps, the total delay time in FIG. 1 is 190 ps, while that in FIG. 2 is 160 ps, and thus the total delay time of signals can be shortened by 16%.

While the delay time of signals can be shortened by applying the present invention in this way, the insulating film 7 provided for reducing the capacitance of mutual wirings is formed only in the flat wiring channel region 8, and therefore, no disconnection of internal wirings occurs in the basic cells.

Moreover, the increase in the film thickness causes no deterioration of the characteristics of the element since the insulating film 7 can be formed independently of a process of forming the element-isolating silicon oxide layer 5, and since the film thickness of the inter-ply insulating film 9 may also be optimized as usual, a difference in level between steps is small in an electrode part of the element, thus causing no disconnection of internal wirings.

Figure 3:
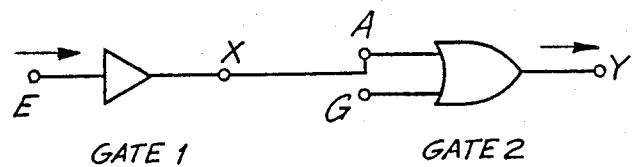
FIGS. 3 and 4 are block and circuit diagrams, respectively, showing logic circuits applicable to the present invention.
Figure 4:
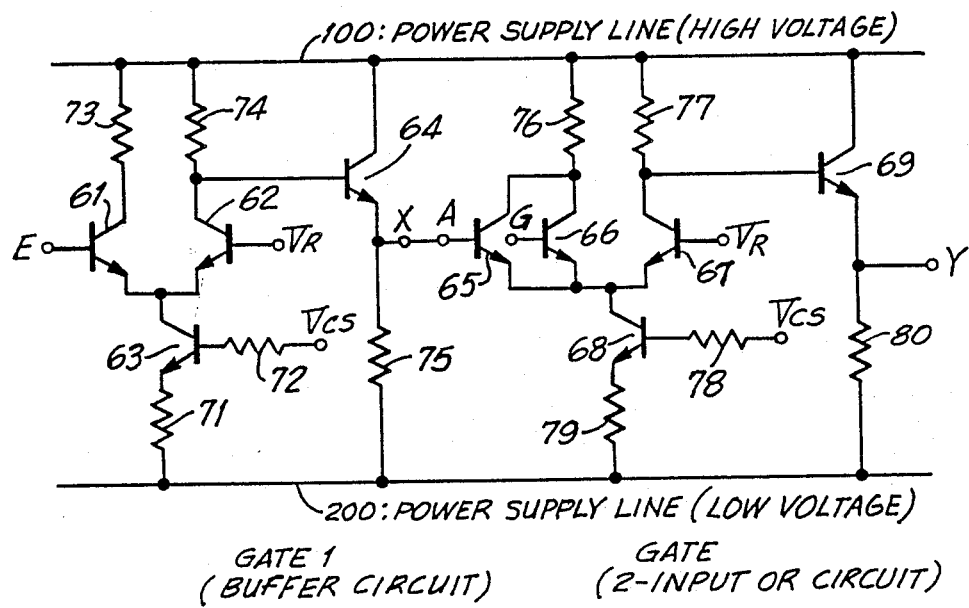

Referring to FIGS. 3 and 4, a buffer circuit (GATE 1) includes bipolar transistors 61 to 64 and resistors 71 to 75, and a 2-input OR circuit (GATE 2) includes bipolar transistors 65 to 69 and resistors 76 to 80. The base (input) of the transistor 61 in the GATE 1 is connected to an output of another logic circuit (not shown) at a node E, and a node X connected to the emitter of the transistor 64 in the GATE 1 and a node F connected to the base of the transistor 65 in the GATE 2 are connected to each other. To a node G connected to the base of the transistor 66 in the GATE 2 is supplied an output signal of another logic circuit (not shown). The emitter of the transistor 69 in GATE 2 is connected to an input of another logic circuit (not shown) at a node Y. Reference voltage $V_R$ is supplied to the base of the transistor 62 and to the base of the transistor 67, respectively, and reference voltage Vcs is supplied to the base of the transistor 63 through the resistor 72 and to the base of the transistor 68 through the resistor 78, respectively.

Figure 5:
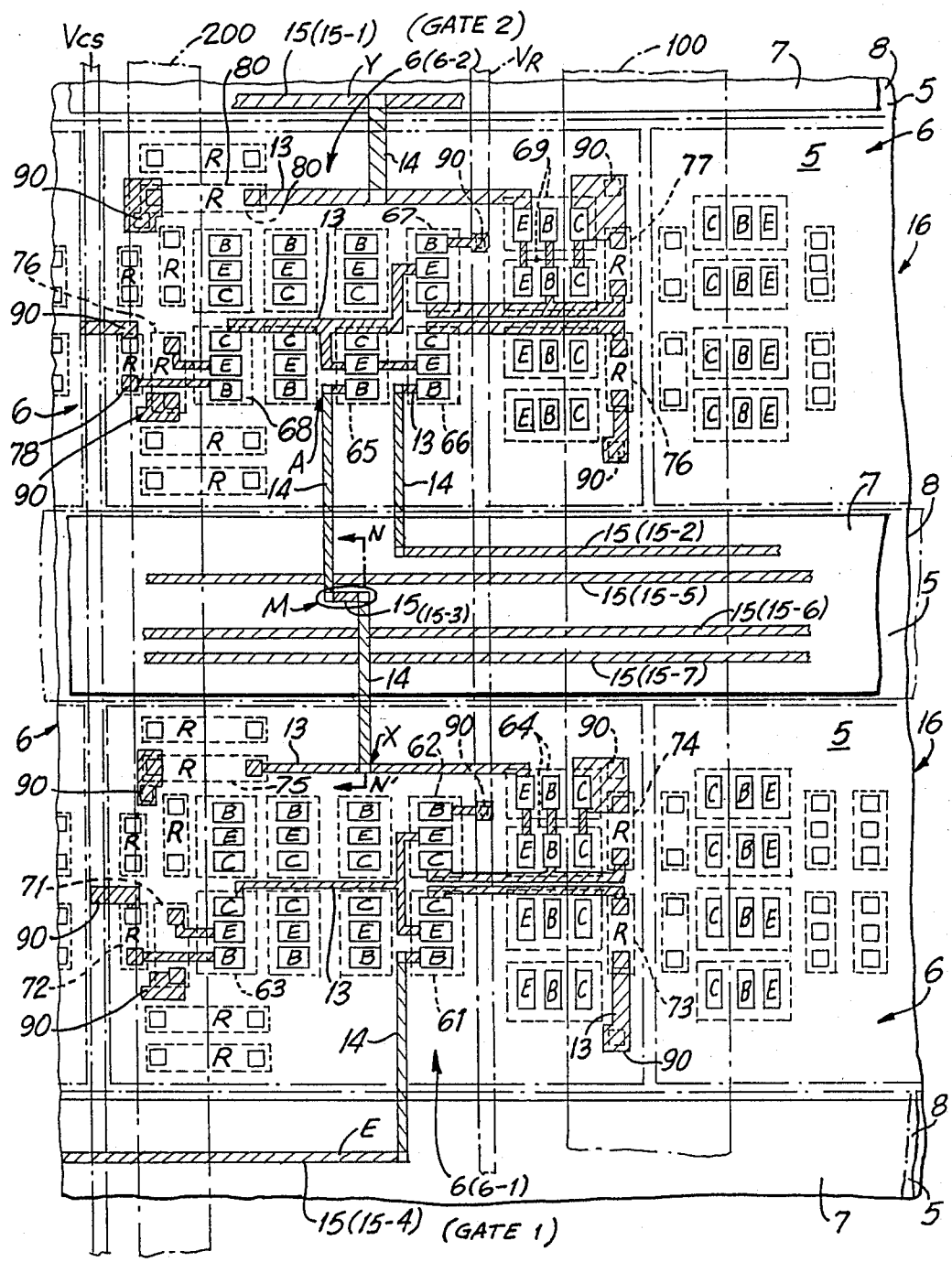
FIG. 5 is a plan view showing an embodiment of the present invention in which the logic circuits shown in FIGS. 3 and 4 are utilized.

Referring to FIG. 5, the same components as those in FIGS. 2 to 4 are indicated by the same reference numerals. Basic cell lines 16 extend in the first direction (horizontal direction in FIG. 5), and wiring channel regions 8 also extend in the first direction with a constant width between respective basic cell lines 16. Each of the basic cell lines 16 is constituted by a plurality of basic cells 6 arranged in the first direction, and in each of the basic cells 6, ten resistors "R" having a rectangular plan shape represented by dot lines and twelve bipolar transistors having a rectangular plan shape represented by dot lines are formed. At the both ends of each resistor, contact portions thereof of small rectangular shape represented by solid lines are provided, and in each transistor a base contact region represented by "B", an emitter contact region represented by "E" and a collector contact region represented by "C" are provided. The field silicon oxide layer 5 is selectively formed in the basic cells 6 such that it surrounds the transistors and resistors, and entirely formed in the belt-like wiring channel regions 8. In the first basic cell 6-1, the buffer circuit (GATE 1) shown in FIG. 4 is constructed of selected transistors 61 to 64, selected resistors 71 to 75 and internal wirings 13 made of the first level aluminum layer represented by right-upward hatching connected to corresponding transistors and/or resistors. Also, in the second basic cell 6-2, the 2-input OR circuit (GATE 2) shown in FIG. 4 is constructed of selected transistors 65 to 69, selected resistors 76 to 80 and internal wirings 13 made of the first level aluminum layer represented by right-upward hatching connected to corresponding transistors and/or resistors in the basic cells 6. Power supply lines 100, 200 and reference voltage lines $V_R$ and $V_{cs}$ are made of the second level aluminum layer of the conductivity level higher than that of the first level aluminum layer and extend in the second direction (vertical direction in FIG. 5) perpendicular to the first direction, and the internal wirings 13 are connected to corresponding lines at respective contact portions 90. To avoid complexity, these lines 100, 200, $V_R$ and $V_{cs}$ are represented by phantom lines in FIG. 5.

On the wiring channel regions 8, a plurality of mutual wirings 15 of the first level aluminum layer represented by right-upward hatching are formed above the thick insulating films 7 of the present invention and extend in the first direction, and the internal wirings 13 in the basic cells 6 and the mutual wirings 15 in the wiring channel regions 8 are connected by the interconnecting wirings 14 which are made of the second level aluminum layer represented by left-upward hatching and extend in the second direction. The contact portions between the first and second aluminum level layers are represented by black areas. Among the mutual wirings 15, the mutual wiring 15-1 is used to send an output signal to another basic cell 6 (another logic gate) or a peripheral circuit 18, and the mutual wiring 15-2 is used to receive a signal from another basic cell to the base of the transistor 66. The mutual wiring 15-3 is used to connect the first basic cell (6-1) (GATE 1) and the second basic cell (6-2) (GATE 2) through the interconnecting wirings 14, and the mutual wiring 15-4 is used to receive an input signal from another basic cell 6 or peripheral circuit 18. Other mutual wirings 15-5, 15-6, 15-7 are used to connect mutually between other basic cells or between another basic cell and the peripheral circuit.

Figure 6A:
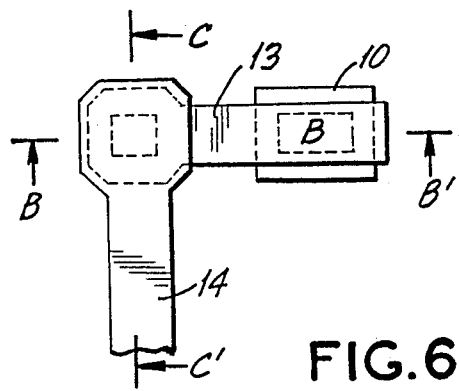
FIG. 6A is an enlarged plan view showing a portion of FIG. 5 in which an internal wiring is connected to a base contact of a bipolar transistor in a basic cell and in turn connected to an interconnecting wiring.
Figure 6B:
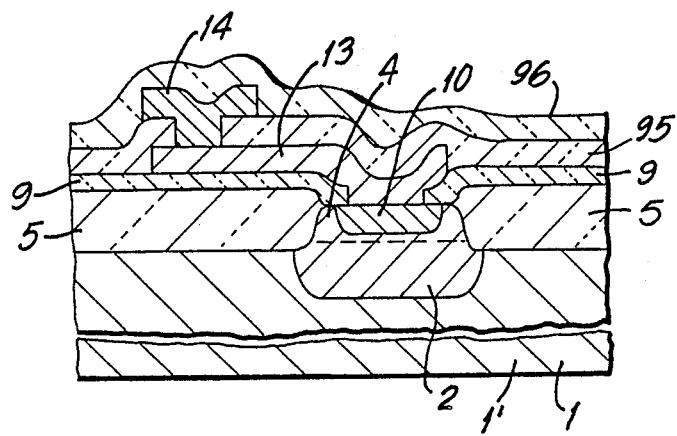
FIGS. 6B and 6C are cross-sectional views taken along lines B—B' and C—C' in FIG. 6A as viewed in the direction of arrows, respectively.
Figure 6C:
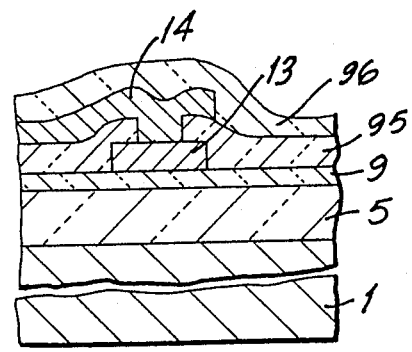

The thick insulating films 7 having belt-like plan shape are only formed on the wiring channel regions 8, and not formed on the basic cells 6 and on the peripheral circuit, and all mutual wirings 15 are formed above the thick insulating films 7, respectively. As shown in FIGS. 6 to 8, the wiring structure of the device is constructed by two levels of conductive layers. FIG. 6A shows an enlarged plan view illustrating a portion of FIG. 5 in which an internal wiring 13 is connected to a base contact of a bipolar transistor in a basic cell 6 and in turn is connected to an interconnecting wiring 14. FIGS. 6B and 6C are cross-sectional views taken along lines B—B' and C—C' of FIG. 6A, respectively. The first level aluminum layer constitutes the internal wirings 13 and the mutual wirings 15 and the second level aluminum layer constitutes the interconnecting wirings 14, power voltage supply lines (FIG. 5) and reference voltage supply lines (FIG. 5). As further seen in FIGS. 6A–6C additional films 95 and 96 are provided in the wiring structure. After forming the first level aluminum pattern, an inter-ply insulating film 95 is entirely deposited, and necessary contact holes are formed in the film 95. Then, the second level aluminum pattern is formed. Finally, a passivation film 96 is entirely formed without the bonding pad areas (not shown) of the device.

Figure 7A:
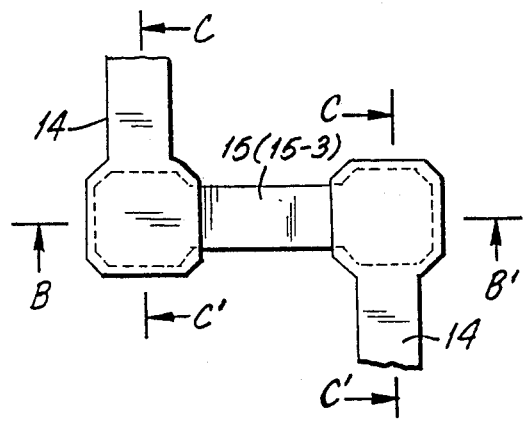
FIG. 7A is an enlarged plan view showing a portion of FIG. 5 encircled by M.
Figure 7B:
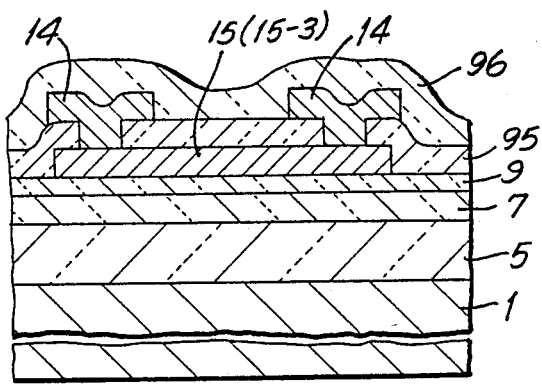
FIGS. 7B and 7C are cross-sectional views taken along lines B—B' and C—C' in FIG. 7A as viewed in the direction of arrows, respectively.
Figure 7C:
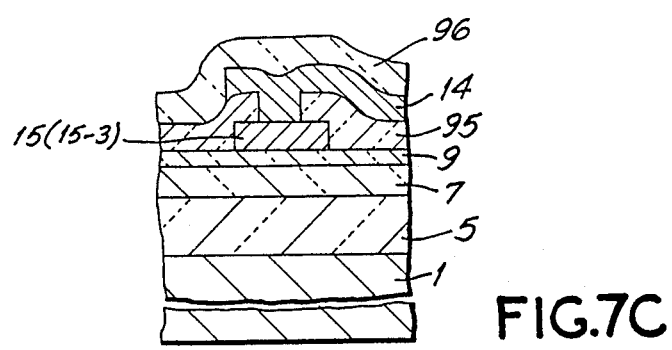
Figure 8:
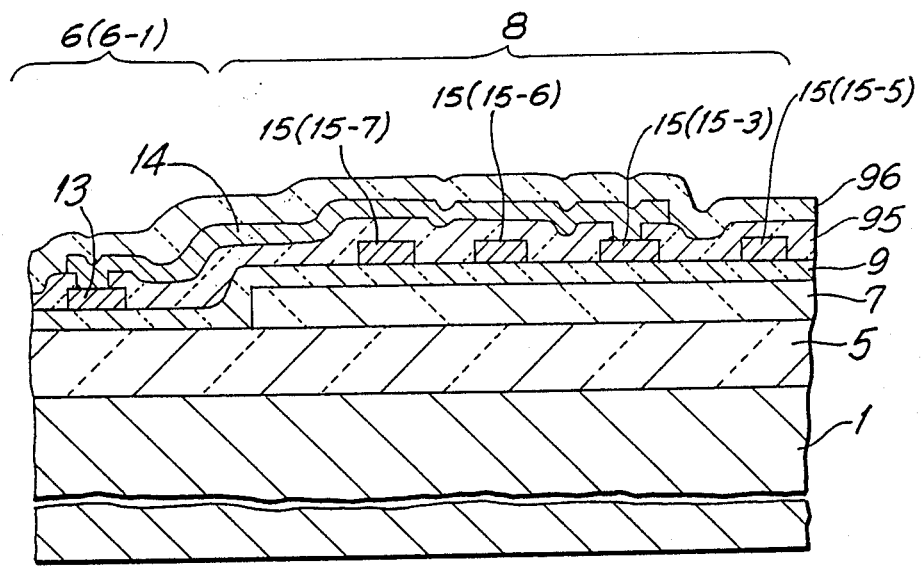
FIG. 8 is an enlarged cross-sectional view taken along line N—N' in FIG. 5 as viewed in the direction of arrows.

FIG. 7A shows a portion of FIG. 5 encircled by M, on an enlarged scale. FIGS. 7B and 7C show cross-sectional views taken along lines B—B' and C—C' of FIG. 7A, respectively. The inter-ply insulating film 95 is deposited on the film 9 similarly to FIGS. 6A–6C and the passivation film 96 is formed over the entire structure without bonding pad areas. FIG. 8 is a cross-section taken along line N—N' of FIG. 5, on an enlarged scale. The same inter-ply insulating film 95 extending over the entire film 9 and encircling mutual wirings 15 and the passivation film 96 deposited over the entire structure which includes basic cells 6 and channel regions 6 are seen in FIG. 8.

What is claimed is:

1. A gate-array type integrated circuit semiconductor device comprising:
    a semiconductor substrate having a major surface and provided with a basic cell forming portion and a wiring channel forming portion, said wiring channel forming portion extending in a first direction;
    a plurality of impurity regions of basic circuit elements formed in said basic cell forming portion to form a plurality of basic cells which constitute a plurality of basic cell lines on said substrate;
    a field insulating layer formed on said substrate, said field insulating layer being partially embedded in said major surface of said substrate and being formed entirely on said wiring channel forming portion and selectively on said basic cell forming portion so as to surround each of said impurity regions of said basic circuit element;
    a first insulating film having a first thickness and formed on said field insulating layer formed on said wiring channel forming portion without extending onto said basic cell forming portion, said first insulating film extending in said first direction with a constant width; and
    a wiring structure including mutual wirings formed of a first level conductive layer, internal wirings formed of said first level conductive layer, and interconnecting wirings formed of a second level conductive layer higher than that of said first level conductive layer,
    each of said mutual wirings being formed only on said first insulating film formed on said wiring channel forming portion and extending in said first direction and being connected to said impurity regions through said interconnecting and internal wirings,
    each of said internal wirings being formed only on said basic cell forming portion and being connected to one of said impurity regions without interposing any other wiring, and
    each of said interconnecting wirings connecting an internal wiring on said basic cell forming portion with a mutual wiring on said wiring channel forming portion and extending in a second direction perpendicular to said first direction.

2. The gate-array type integrated circuit semiconductor device of claim 1, and further comprising a second insulating film having a second thickness less than said first thickness of said first insulating film and covering said first insulating film, said field insulating layer and said impurity regions of said basic circuit elements such that said mutual wirings are attached to said second insulating film above said wiring channel forming portion and that said internal wirings are attached to said second insulating film on said basic cell forming portion.

3. The gate-array type integrated circuit semiconductor device of claim 1, wherein said first and second level conductive layers are made of aluminum.

4. The gate-array type integrated circuit semiconductor device of claim 2, wherein said first and second insulating films are made of silicon oxide.

5. The gate-array type integrated circuit semiconductor device of claim 1, and further comprising peripheral circuits formed on a peripheral portion of said substrate.

6. The gate-array type integrated circuit semiconductor device of claim 5, wherein said peripheral circuits are input/output buffer circuits of the device.

7. The gate-array type integrated circuit semiconductor device of claim 1, wherein said first insulating film has a thickness of 0.7 µm or more and 1.5 µm or less.

8. The gate-array type integrated circuit semiconductor device of clam 2, wherein said first insulating film has a thickness of 0.7 µm or more and 1.5 µm or less, and said second insulating film has a thickness of 0.2 µm or more and 0.5 µm or less.

* * * * *